(12) United States Patent
Cheng et al.

(10) Patent No.: US 8,133,803 B2
(45) Date of Patent: Mar. 13, 2012

(54) METHOD FOR FABRICATING SEMICONDUCTOR SUBSTRATES AND SEMICONDUCTOR DEVICES

(75) Inventors: Yuh-Jen Cheng, Taipei (TW); Ming-Hua Lo, Jhongli (TW); Hao-Chung Kuo, Jhubei (TW)

(73) Assignee: Academia Sinica, Nankang Taipei (TW)

( * ) Notice: Subject to any disclaimer, the term of this patent is extended or adjusted under 35 U.S.C. 154(b) by 151 days.

(21) Appl. No.: 12/489,688

(22) Filed: Jun. 23, 2009

(65) Prior Publication Data

US 2010/0323506 A1    Dec. 23, 2010

(51) Int. Cl.
*H01L 21/20* (2006.01)
*H01L 21/36* (2006.01)

(52) U.S. Cl. .............. 438/507; 438/42; 438/43; 438/44; 438/46; 257/E21.101

(58) Field of Classification Search .............. 438/39–44, 438/504, 507; 257/E21.101
See application file for complete search history.

(56) References Cited

U.S. PATENT DOCUMENTS

| | | | |
|---|---|---|---|
| 6,617,261 B2 | 9/2003 | Wong et al. | |
| 7,202,141 B2 | 4/2007 | Park et al. | |
| 7,241,667 B2 | 7/2007 | Park et al. | |
| 2003/0134446 A1* | 7/2003 | Koike et al. | 438/41 |
| 2005/0112885 A1* | 5/2005 | Rayssac et al. | 438/689 |
| 2005/0124143 A1* | 6/2005 | Roycroft et al. | 438/476 |
| 2005/0186757 A1 | 8/2005 | Wu et al. | |
| 2006/0033119 A1* | 2/2006 | Shibata | 257/103 |
| 2006/0246722 A1 | 11/2006 | Speck et al. | |
| 2006/0270076 A1* | 11/2006 | Imer et al. | 438/22 |
| 2007/0015345 A1* | 1/2007 | Baker et al. | 438/481 |
| 2008/0124510 A1 | 5/2008 | Xu et al. | |
| 2009/0008652 A1 | 1/2009 | Ueda et al. | |
| 2009/0162959 A1* | 6/2009 | Hsu et al. | 438/33 |

* cited by examiner

*Primary Examiner* — Angel Roman
(74) *Attorney, Agent, or Firm* — Cozen O'Connor

(57) ABSTRACT

A method for fabricating a semiconductor layer comprising: a) growing a semiconductor layer on a foreign substrate; b) forming at least one opening on the semiconductor layer, wherein the opening exposes the interface between the semiconductor layer and the foreign substrate; and c) removing at least part of the semiconductor solid state material along the interface between the semiconductor layer and the foreign substrate. The removing step c) is preferably achieved by selective interfacial chemical etching. The semiconductor layer may be utilized as a substrate for fabrication of a wide variety of electronic and opto-electronic devices and integrated circuitry products.

27 Claims, 3 Drawing Sheets

METHOD FOR FABRICATING SEMICONDUCTOR SUBSTRATES AND SEMICONDUCTOR DEVICES

BACKGROUND OF THE INVENTION

1. Field of the Invention

The current invention relates to methods for fabricating large area, low defect density semiconductor substrates and devices. Such substrates are the basis of optoelectronics and microelectronics device applications, such as light emitting diodes, laser diodes, and high electron mobility transistors.

2. Description of the Related Art

Metallic nitride, in particular Groups III-V nitride semiconductors have been widely used in UV and blue to green light emitting diodes and short wavelength laser diode applications. They are also a very important material in high electron mobility devices. The most popular growth method for GaN is by vapor-phase synthesis, for example metalorganic chemical vapor deposition (MOCVD), hydride vapor-phase epitaxy (HVPE), molecular-beam epitaxy (MBE), metal-organic chloride (MOC), and so on. Since large III-nitride substrates are not readily available, the III-nitride semiconductor devices have often been heteroepitaxially grown upon different substrates, for example sapphire, silicon carbide (SiC), silicon (Si), gallium arsenide (GaAs), and so on. Among them, sapphire is the most widely used substrate (template) due to its stable material properties.

The lattice constant mismatch between GaN and sapphire is however relatively large. This poses a big challenge to grow a low defect crystal material. In addition, the thermal expansion coefficient mismatch between GaN and substrates can also introduce stress into GaN thin film during growth process and result in micro cracks in the film when the substrate temperature is cycled in the growth process. These mismatched factors lead to a large number of defects, as large as $10^{8-9}$ cm$^{-2}$, in the grown GaN material and can significantly affect the performance of the devices subsequently fabricated on top of it. It is very important to reduce the number of crystal defects to improve the device performance. From application point of view, the epitaxial substrates that are used for growing GaN may also have some unwanted properties that can seriously limit the device applications and/or mass production, for example, low thermal conductivity, not electrically conducting, hard to cleave, etc. It is therefore desirable to remove the substrate from the grown GaN material as early as possible in the steps of fabrication processes.

There have been various methods to remove sapphire substrate (template) from the grown GaN thin film. These methods include mechanical grinding, chemical etching, interfacial decomposition, and interfacial structure fracturing. The mechanical grinding process is time consuming because sapphire is a fairly hard material and it requires precise handling to achieve large area uniformity. Chemical etching, either wet or dry etching, is a difficult and slow process because sapphire is a relatively chemical inert material. The interfacial decomposition that uses laser ablation to remove a thin layer of GaN at the sapphire interface is a sequential process, therefore, is also a time consuming process. This approach requires an expansive UV laser equipment. The interfacial fracturing approach requires extra micro fabrication processes to create a mechanically weak layer prior the GaN growth.

Therefore, there is a need for a simple, fast, easy, and/or low-cost process of making a low defect density and/or large area metallic nitride (in particular III-V nitride) semiconductor substrate or device.

SUMMARY OF THE INVENTION

In accordance with one embodiment, the present application provides a method for fabricating a semiconductor layer made of a semiconductor solid state material. The method comprises the steps of:

a. growing a semiconductor layer on a foreign substrate, which is made of a foreign material; wherein the foreign material is different from the semiconductor solid state material;

b. forming at least one opening on the semiconductor layer, wherein the opening exposes the interface between the semiconductor layer and the foreign substrate; and c. removing at least part of the semiconductor solid state material along the interface between the semiconductor layer and the foreign substrate.

Preferably, the removing step c) is achieved by selective interfacial chemical etching. The semiconductormetallic solid state material near the interface between the semiconductor layer and the foreign substrate preferably has a higher defect density than the remaining semiconductor solid state material or has different material composition or in combination to facilitate the removing step c).

As one embodiment, the method described above may comprise a further step of filling the at least one opening on the semiconductor layer with additional semiconductor solid state material. Preferably, the method may further comprise a step of uniformly covering the semiconductor layer with additional semiconductor solid state material.

In accordance with one embodiment, the removing step c) removes only a part of the semiconductor solid state material along the interface between the semiconductor layer and the foreign substrate so that the semiconductor layer is only partially connected to the foreign substrate. Subsequently, for example, after the at least one opening is filled, the semiconductor layer partially connected to the foreign substrate may be completely removed from the foreign substrate, by e.g., breaking the partial connection with chemical etching or temperature change or mechanical force.

The forming step b) may be accomplished by semiconductor patterning technique, such as photolithography and imprint processes, or defect selective etching. The defect selective etching comprises immersing the semiconductor-metallic solid state material in an aqueous or liquid phase etching chemical composition.

The semiconductor solid state material may be a metallic nitride material, preferably, a III-V nitride material such as GaN, AlN, InN, AlGaN, GaInN, AlInN, AlGaInN, and combinations thereof, more preferably, GaN. The semiconductor solid state material may also be other material that is hard to grow in a large scale wafer due to lack of suitable foreign substrate with matching lattice constant, such as ZnO and CdTe and Group II-VI compounds.

The foreign material may be sapphire, silicon carbide, silicon, gallium arsenide, lithium gallate, zinc oxide, and combinations thereof. Preferably, the foreign material is sapphire.

The growing step a) may be carried out by a technique selected from the group consisting of metalorganic chemical vapor deposition (MOCVD), hydride vapor-phase epitaxy (HVPE), molecular-beam epitaxy (MBE), metal-organic chloride (MOC), and combinations thereof preferably MOCVD.

Preferably, a plurality of openings are formed in the forming step b). The openings may be formed randomly or in a specific pre-designed pattern.

Large area, low defect density metallic nitrate layers produced in accordance with the present invention can be utilized as a substrate for fabrication of a wide variety of electronic and opto-electronic devices and integrated circuitry products. The invention therefore contemplates electronic device structures including the large area, low defect density metallic nitride layer, on which is fabricated a device, such as for example a laser diode, a light-emitting diode, or a high electron mobility transistor, as well as integrated circuit including such free-standing metallic nitrate layers. The semiconductor layers have at least one epitaxial layer thereon, which may be homoepitaxial or heteroepitaxial in character, depending on the specific application and end use of the semiconductor based product.

As can be seen from the above, the present application provides a significant improvement over the prior art in providing a simple, easy-to-operate, low-cost process of fabricating a large area and/or low defect density semiconductor substrate suitable for fabrication of microelectronic and opto-electronic devices.

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention

DETAILED DESCRIPTION OF THE PRESENTLY PREFERRED EMBODIMENTS

Figure 1:
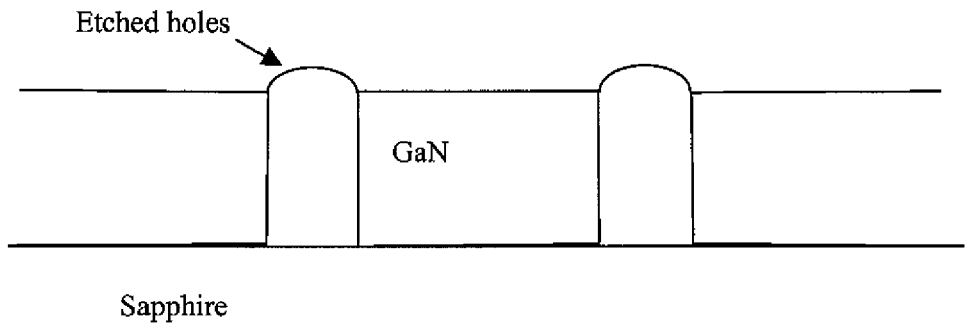
FIG. 1 illustrates several opening holes etched through a GaN layer on a sapphire substrate in accordance with one embodiment of the present invention.

The present application describes methods of fabricating large area, low defect density semiconductor, in particular III-V nitride substrates and semiconductor devices.

The description hereinafter primarily refers to GaN as an embodiment in accordance with the present invention. It is understood that the same approach can be applied to other III-nitride materials, including binary compounds AlN and InN, and ternary compounds AlGaN, GaInN, and AlInN, and the quaternary compound AlGaInN. This approach can also be applied to other groups of semiconductor material including ZnO and CdTe and Group II-VI compounds. The description of heteroepitaxial substrate (template) primarily refers to sapphire as an embodiment in accordance with the present invention. The method can also be applied to other foreign substrates like silicon carbide, silicon, gallium arsenide, lithium gallate, zinc oxide, etc. The description of growth method mainly refers to metalorganic chemical vapor deposition (MOCVD) as an embodiment in accordance with the present invention. The approach can also be applied to other growth techniques, e.g. hydride vapor-phase epitaxy (HVPE), molecular-beam epitaxy (MBE), and metal-organic chloride (MOC), etc.

The method starts with a heteroepitaxially grown GaN thin film on a foreign template, for example sapphire. The GaN can be grown for example by, but not limited to, MOCVD. An epitaxial layer of III-nitride is first grown on a sapphire substrate. The growth process is controlled such that the material property or composition near sapphire interface is made less resistive to a certain etching process than those further away from the interface region. One may use low temperature MOCVD growth, for example lower than 600° C., to grow a thin layer of GaN, say smaller than 1 μm, followed by a high temperature growth, for example higher than 700° C., of say 2 μm GaN. The low temperature grown GaN near sapphire interface has significantly higher defect density than the high temperature grown GaN does. The high defect density GaN is less resistive to chemical etching than the low defect density one, for example in aqueous or molten KOH or $H_3PO_4$ solution. To further assist the selective interfacial etching, the sapphire surface may be pre-deposited with a thin layer of sacrifice material, for example SiOx or SiNx. The sacrifice layer has a distribution of openings exposing the sapphire surface to allow for GaN growth. The above GaN growth procedure is applied so that defect density is higher at the GaN-sapphire interface. GaN growth fills up the openings and uniformly covers over the sacrifice layer, which becomes embedded under GaN layer. The sacrifice layer can be selectively cleared away by chemical wet etching through opening holes created on the GaN surface in later step, which will be described shortly. Another way is to grow high Al content of $Al_xGa_{1-x}N$ on sapphire first, where x is the Al content percentage, followed by regular GaN growth. $Al_xGa_{1-x}N$, including AlN, has higher etching rate than GaN does in aqueous or molten KOH or $H_3PO_4$ solution. In all the above growth procedures, the material near sapphire interface is made less resistive to an etching process than the material further away from sapphire interface. The overall III-nitride thickness typically can be around 1-3 μm but may be thinner or thicker depending on specific need.

Figure 2:
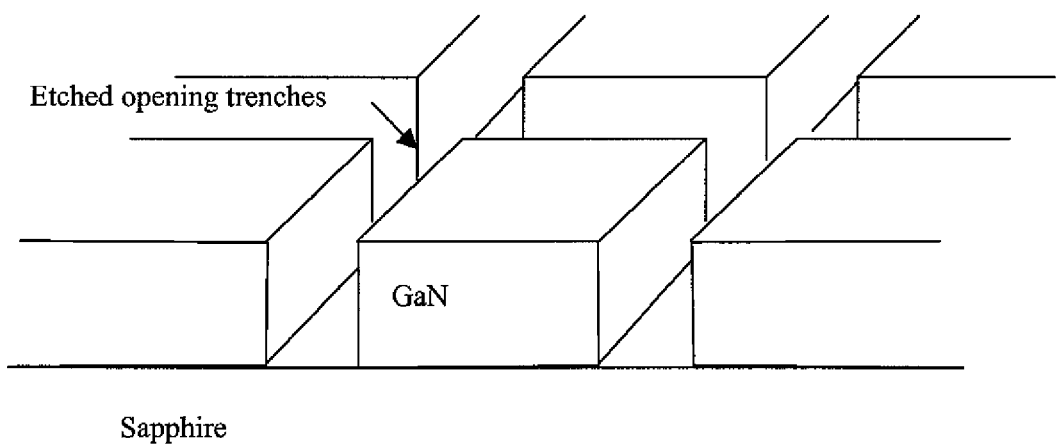
FIG. 2 illustrates trenches openings etched through a GaN layer on a sapphire substrate in accordance with one embodiment of the present invention.

The GaN wafer is then put under an etching process. The etching process is mainly to remove, or at least partially remove, a thin layer of material near the sapphire interface. One can use chemical wet etching to selectively etch away a thin interfacial layer near the sapphire interface because the material or the material composition near the interface is made less resistive to etching than the material further away from the interface as mentioned above. The etching process may start from creating at least an opening to expose part of the interface between GaN and sapphire substrate, where the less etching resistive material is located. If the GaN-sapphire interface is already well exposed at the edge of wafer, the interfacial etching may start right from the edge of wafer. Depending on specific etching process, the chemical reactant may take long time to diffuse into the etched interfacial channel as the etching process goes deeper into the GaN-sapphire interface. If this is the case, the etching time may become impractically long for removing a large area of GaN-sapphire interface. To speed up the process and make the etching time less depending on the size of substrate, one can create more openings on GaN wafer surface in order to expose more GaN-sapphire interface sites to etching chemicals. The shape and the distribution of the openings can be varied depending on process needs. They can be isolated holes, connected openings, or in combination. The schematic cross section of GaN thin film with isolated holes is shown in FIG. 1. The schematic cross section of GaN thin film with opening trenches is shown in FIG. 2.

The fabrication of the opening holes on GaN wafer can be created by standard semiconductor photolithography technique. In such a case, an etching mask layer with pre-designed opening pattern is first fabricated on the GaN wafer surface. The mask material can be $Si_3N_4$ or Ni or other suitable material. The GaN wafer then undergoes an etching process to etch opening holes down to sapphire interface, for example inductive coupled plasma (ICP) etching. The etching mask layer is subsequently removed, for example $Si_3N_4$ can be dissolved in BOE wet chemical etching and Ni can be dissolved in $HNO_3$ solution.

Figure 3:
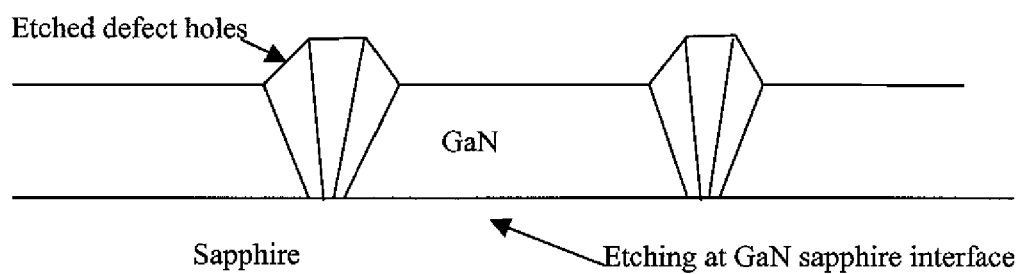
FIG. 3 illustrates several holes etched through a GaN layer on a sapphire substrate by defect selective etching in accordance with one embodiment of the present invention.

Another way to create opening holes is to use defect selective etching process. Since there are usually quite some crystal defect sites on GaN surface, one can use defect selective etching, i.e. etching only occurs at defect sites, to create pits on GaN surface and let the etching process continues downward until at least some pits reach down to sapphire interface. This can be done for example by immersing GaN wafer in high temperature (>200° C.) high concentration aqueous or liquid phase (molten) KOH solution. Other chemicals like $H_2SO_4$, $H_2P_3O_4$ can also be used. The etched holes may have hexagonal crystal shape and are randomly distributed. There could be some pits not reaching the sapphire interface. These will not affect the subsequent processes. A schematic cross section is shown in FIG. 3.

Figure 4:
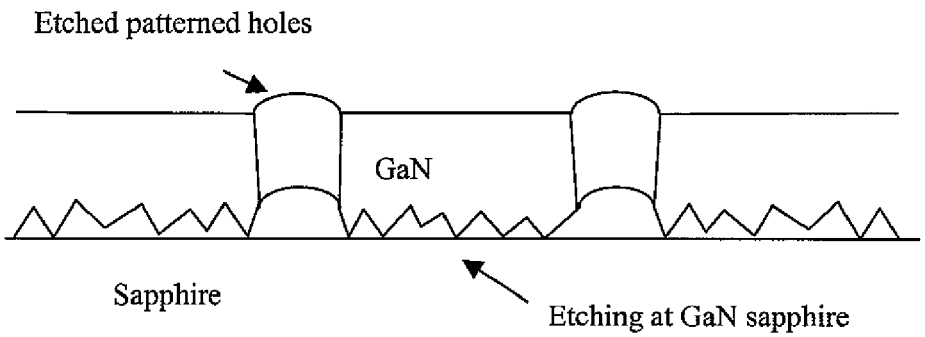
FIGS. 4(a) and (b) illustrate lateral etching along the interface between a GaN layer and sapphire in accordance with one embodiment of the present invention.
Figure 4:
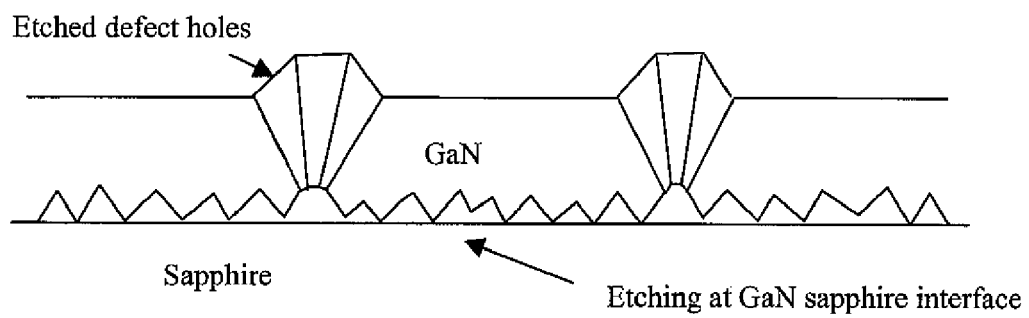

The next step is to have the etching process go laterally along the GaN sapphire interface. This can be achieved by for example immersing the GaN wafer from previous step in aqueous or liquid phase chemicals like KOH, $H_2SO_4$, $H_3PO_4$, HCl, etc. A specific example could be high temperature (>200° C.) high concentration aqueous or liquid phase (molten) KOH solution. The previously described sacrifice material, if it has been selectively deposited on sapphire, can be selectively etched away by immersing the sample in BOE wet etching chemical. The interface etched sample is illustrated in FIG. 4(a) for openings created by photolithography patterning or FIG. 4(b) for openings created by defect selective etching. The lateral etching process may create additional opening holes and surface pits but there will be just few since the interfacial etching is much faster than surface defect etching. The additional holes or pits formed in this step will not affect the subsequent processes. The size and shapes of the holes, the distance between opening holes, and the interfacial etching speed may be adjusted based on specific needs and processes. The openings may be isolated holes or connected holes or in combination depending on the fabrication process needs. If the interfacial etching speed is fast, the separation of openings can be large and vice versa depending on process requirement. The etching process may continue till GaN layer is fully detached from sapphire substrate and becomes a free standing GaN thin film. Alternatively, the etching may be interrupted such that there are still portions of GaN still in contact with sapphire for handling the top GaN film structure for subsequent fabrication processes. The etched structure at the GaN sapphire interface typically may have random distribution of crystalline morphology, for example an inversed pyramid structure with pyramid tips standing on sapphire substrate when etching process is properly interrupted as shown in FIG. 4.

Figure 5:
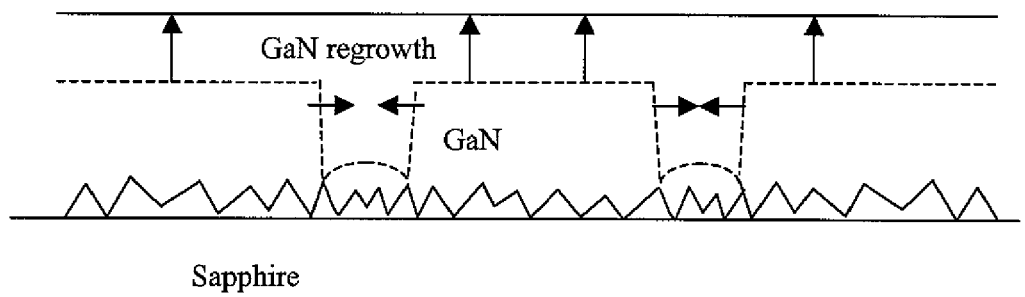
FIG. 5 illustrates re-growth of GaN on the pre-existing GaN layer and the holes formed through the pre-existing GaN layer in accordance with one embodiment of the present invention.

The etched GaN wafer or the free standing GaN thin film with opening holes is then put back into re-growth process using MOCVD or by other epitaxial growth methods with adjusted growth parameters. The re-growth process parameters can be tuned to promote film growth to cover the whole GaN wafer surface and at the same time fill the opening holes by bridging the sidewalls of the holes together to provide full wafer flat surface for subsequent device application. The re-growth process can still leave the etched space created between GaN and sapphire pretty much not changed as shown in FIG. 5.

Alternatively, the regrowth step may be controlled to just fill the surface pits without bridging the side walls of the openings. For example, the opening trenches as shown in FIG. 2 may be designed to be the dicing pattern for the final device applications. The trench opening dimension between two side walls can also be made large enough to help preventing side wall bridging. Further device structure, for example light emitting diode, may be grown on top the re-grown GaN layer in the same growth run if needed. In this process, these trenches can be used to help final device dicing.

Figure 6:
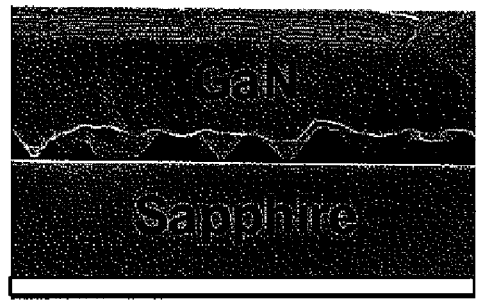
FIG. 6 shows SEM image of the re-grown GaN wafer in accordance with one embodiment of the present invention.
Figure 7:
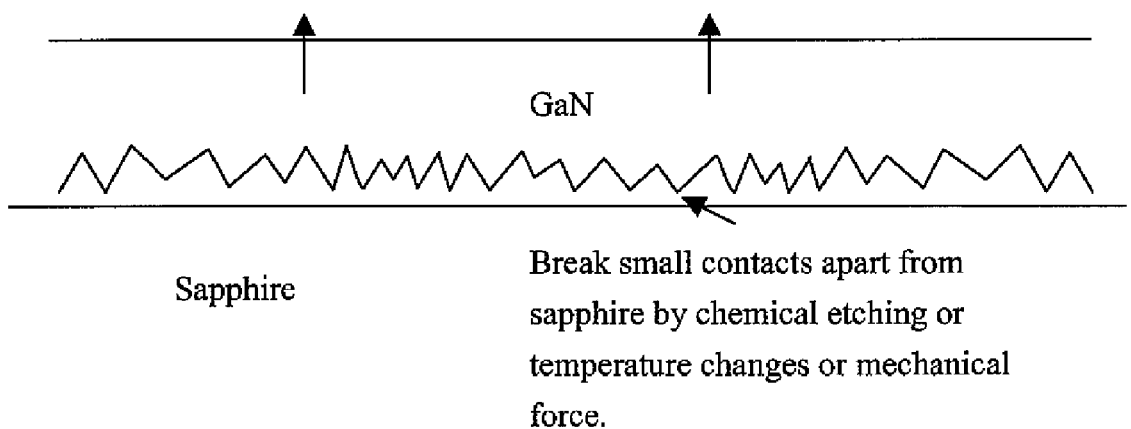
FIG. 7 illustrates separation of a GaN layer from a foreign sapphire substrate in accordance with one embodiment of the present invention.

The re-grown GaN wafer is only attached to the bottom sapphire substrate through small area of contacts. The size of contacts can be controlled by adjusting etching parameters. The contacts may be just point contacts as shown in FIG. 6. The GaN thin film can be then easily removed by further chemical etching or temperature change or mechanical force as illustrated in FIG. 7. The re-grown GaN film can be separated from sapphire by immersing it in chemical solutions of less aggressive etching, for example at smaller than 150° C., not in a high concentration molten or aqueous KOH solution. The aqueous chemical solution can go into the interfacial opening space, etch away the point like contacts, and easily separate the GaN film from sapphire. The etching is made less aggressive so that it will not etch the top surface or it only at most creates point like pits. Alternatively, the re-grown GaN wafer can also be either heated up or cooling down and let the shear stress created from the thermal expansion coefficient mismatch between GaN and sapphire to break apart the interfacial small area contacts. Another mechanical way is to bond the top GaN surface to another template and apply mechanical force to pull apart the GaN film from sapphire. The bottom rough GaN surface can be smoothened by chemical, mechanical, or both chemical and mechanical polishing process if needed. In LED device applications, the bottom rough surface can enhance LED light extraction efficiency. In such a case, there is no need to polish the bottom rough surface.

EXAMPLE 1

The following example is provided to illustrate, but not to limit, the etching process in accordance with one embodiment of the present invention.

A 2.5 um thick of GaN thin film is grown on a sapphire substrate by MOCVD.

The GaN wafer is immersed in 200° C., molten KOH solution for 25 minutes (defect selective etching process instead of patterned hole method is used in this case). After 25 minutes, random distribution of opening holes is formed on GaN surface. Most of opening holes reach sapphire surface and allow lateral interfacial GaN etch to occur. As a result, the GaN wafer becomes as shown in FIG. 4(b) with only point contacts attached to the sapphire substrate.

The etched GaN wafer is put back for MOCVD re-growth to bridge the etched opening holes and to grow a continuous flat surface, as shown in FIG. 5. Depending on the application, a LED device structure can be grown on top of the flat surface in the same MOCVD run if needed. A scan electron micrograph (SEM) of the re-grown GaN wafer is shown in FIG. 6.

The interfacial point contacts between GaN and sapphire are broken by applying a slight mechanical bending force to the bottom sapphire surface. This also can be accomplished by wet chemical etching, for example by immersing in 150° C. molten KOH solution for a few minutes (temperature and concentration may vary depending on GaN material quality). Separation of a GaN layer from a foreign sapphire substrate in accordance with one embodiment of the present invention is illustrated in FIG. 7.

The invention is not limited by the embodiments described above which are presented as examples only but can be modified in various ways within the scope of protection defined by the appended patent claims.

We claim:

1. A method for fabricating a semiconductor layer made of a semiconductor solid state material; wherein the method comprises the steps of:
   a. growing a semiconductor layer on a foreign substrate, which is made of a foreign material; wherein the foreign material is different from the semiconductor solid state material, and the semiconductor layer is continuous;
   b. forming at least one opening through the semiconductor layer, wherein the opening exposes the interface between the semiconductor layer and the foreign substrate; and
   c. removing at least part of the semiconductor solid state material along the interface between the semiconductor layer and the foreign substrate.

2. The method of claim 1 wherein the removing step c) is achieved by selective interfacial chemical etching.

3. The method of claim 1 wherein to facilitate the removing step c), the semiconductor solid state material near the interface between the semiconductor layer and the foreign substrate has a) a higher defect density or b) a different composition than the remaining semiconductor solid state material or c) a combination of a) and b).

4. The method of claim 1 further comprising a step of filling the at least one opening through the semiconductor layer with additional semiconductor solid state material.

5. The method of claim 4 further comprising a step of uniformly covering the semiconductor layer with additional semiconductor solid state material.

6. The method of claim 1 wherein in the removing step c) only a part of the semiconductor solid state material along the interface between the semiconductor layer and the foreign substrate is removed so that the semiconductor layer is only partially connected to the foreign substrate.

7. The method of claim 6 further comprising a step of completely removing the semiconductor layer from the foreign substrate.

8. The method of claim 7 wherein the step of completely removing comprises breaking the partial connection between the semiconductor layer and the foreign substrate by chemical etching.

9. The method of claim 7 wherein the step of completely removing comprises breaking the partial connection between the semiconductor layer and the foreign substrate by a) heating or b) cooling the substrate or combination of a) and b).

10. The method of claim 7 wherein the step of completely removing comprises a step of bonding the top surface of the semiconductor layer to another template so that mechanical force can be applied on the another template to completely remove the semiconductor layer from the foreign substrate.

11. The method of claim 7 wherein the step of completely removing comprises breaking the partial connection between the semiconductor layer and the foreign substrate by mechanical force.

12. The method of claim 1 wherein the forming step b) is accomplished by semiconductor patterning technique.

13. The method of claim 12 wherein the semiconductor patterning technique is selected from the group consisting of photolithography and imprint processes.

14. The method of claim 1 wherein the forming step b) is accomplished by defect selective etching.

15. The method of claim 14 wherein the defect selective etching comprises immersing the semiconductor solid state material in an aqueous or liquid phase etching chemical composition.

16. The method of claim 1 wherein the semiconductor solid state material is a metallic nitride material.

17. The method of claim 16 wherein the metallic nitride material is a III-V nitride material.

18. The method of claim 16 wherein the metallic nitride material is selected from the group consisting of GaN, AlN, InN, AlGaN, GaInN, AlInN, AlGaInN, and combinations thereof.

19. The method of claim 16 wherein the metallic nitride material is GaN.

20. The method of claim 1 wherein semiconductor solid state material is selected from the group consisting of ZnO, CdTe, Groups II-VI compounds, and combinations thereof.

21. The method of claim 1 wherein the foreign material is selected from the group consisting of sapphire, silicon carbide, silicon, gallium arsenide, lithium gallate, zinc oxide, and combinations thereof.

22. The method of claim 1 wherein the foreign material is sapphire.

23. The method of claim 1 wherein the growing step a) is carried out by a technique selected from the group consisting of metalorganic chemical vapor deposition (MOCVD), hydride vapor-phase epitaxy (HVPE), molecular-beam epitaxy (MBE), metal-organic chloride (MOC), and combinations thereof.

24. The method of claim 1 wherein the growing step a) is carried out by metalorganic chemical vapor deposition (MOCVD).

25. The method of claim 1, wherein in the forming step a plurality of openings are formed.

26. A method of making a semi-conductor device article comprising 1) fabricating a metallic nitride layer according to claims 1 and 2) fabricating an electronic device structure on the metallic nitride layer to make the semi-conductor device article.

27. The method of claim 26 wherein the electronic device structure comprises a component selected from the group consisting of a laser diode, a light-emitting diode, a high electron mobility transistor, an integrated circuit, and combinations thereof.

* * * * *